United States Patent [19]

McMahon, Jr.

[11] 4,220,917
[45] Sep. 2, 1980

[54] TEST CIRCUITRY FOR MODULE INTERCONNECTION NETWORK

[75] Inventor: Maurice T. McMahon, Jr., Wappingers Falls, N.Y.

[73] Assignee: International Business Machines Corporation, Armonk, N.Y.

[21] Appl. No.: 929,480

[22] Filed: Jul. 31, 1978

[51] Int. Cl.² ............ G01R 31/02; G01R 31/22
[52] U.S. Cl. .................................. 324/73 R; 324/51
[58] Field of Search ............ 324/73 R, 51, 158 P, 324/158 F; 235/302

[56] References Cited

U.S. PATENT DOCUMENTS

| | | | |
|---|---|---|---|
| 3,746,973 | 7/1973 | McMahon | 324/51 |
| 3,781,683 | 12/1973 | Freed | 324/73 R X |
| 3,789,205 | 1/1974 | James | 324/73 R X |
| 3,803,483 | 4/1974 | McMahon | 324/51 |
| 3,815,025 | 6/1974 | Jordan | 324/73 R |
| 4,055,754 | 10/1977 | Chesley | 324/73 R X |
| 4,140,967 | 2/1979 | Balasubramanian et al. | 324/73 R |

Primary Examiner—Gerard R. Strecker
Attorney, Agent, or Firm—James E. Murray

[57] ABSTRACT

This specification deals with testing of a network of electrical interconnections between chips mounted on an insulative substrate of a module and between the chips and the input and output pins of the module. Each of the mounted chips contains masking circuits which can be activated to prevent controlling signals from the outputs of logic circuits on the chip from being transmitted off the chip and into the interconnection network. Also each of the chips contains emitter follower circuits that logically connect all the chip input terminals to a common output terminal of the chip. In testing the mask circuits are activated. Then potential levels are selectively applied to a plurality of test points in the interconnection network and differences in potential level between these test points and/or between the points and one or more of the common terminals are determined.

8 Claims, 6 Drawing Figures

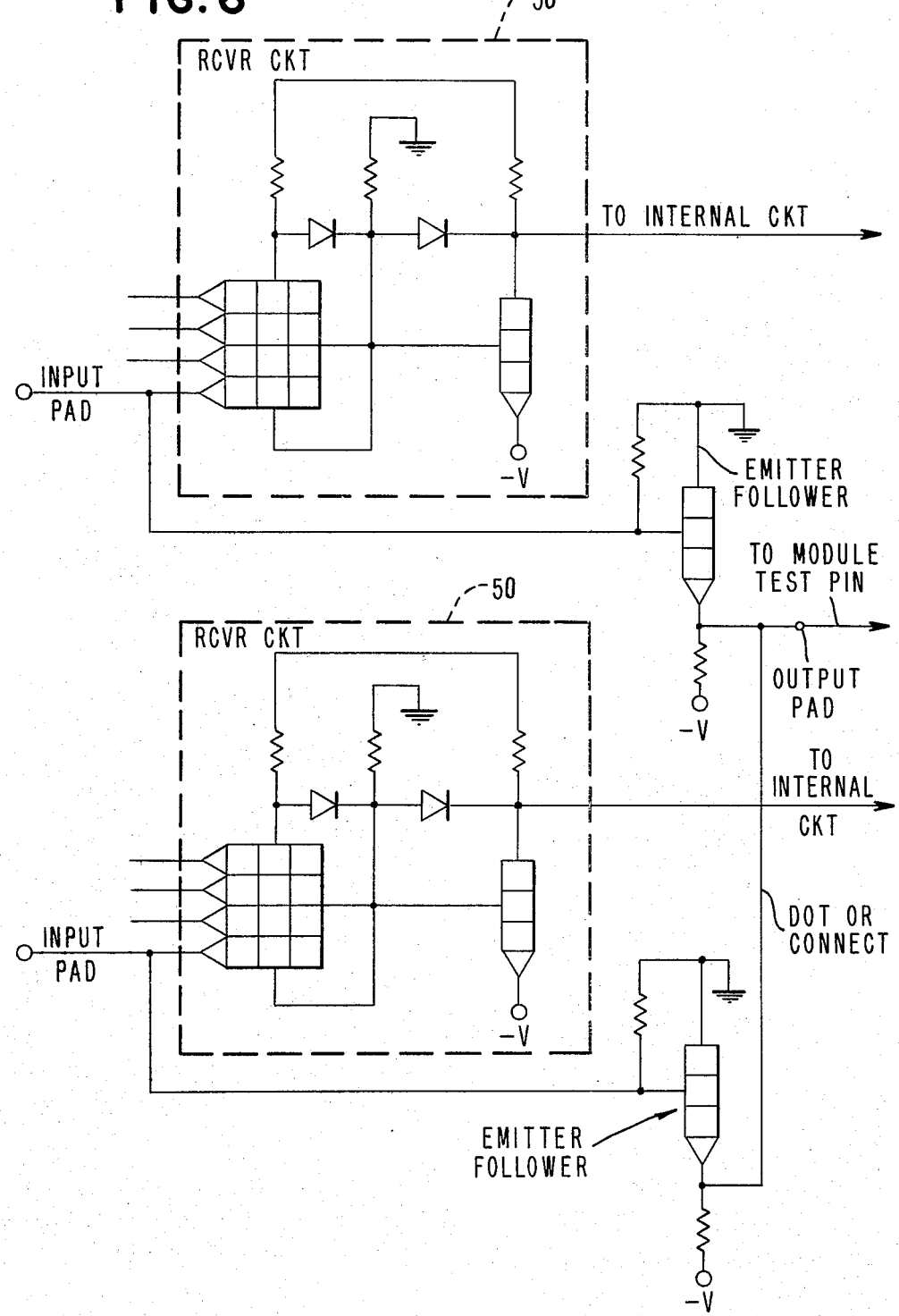

TEST CIRCUITRY FOR MODULE INTERCONNECTION NETWORK

BACKGROUND OF THE INVENTION

The present invention relates to the testing of the interconnector networks on insulative surfaces which are to support integrated circuit chips in integrated circuit package units or modules.

With the ever-increasing microminiaturization of integrated circuit chips, testing of networks of electrical interconnections between such chips on substrates of modules containing the chips by physically accessing test points on the chips and the substrate is becoming exceedingly difficult. At one time it was conventional practice to use test probes to simultaneously contact all of the test points in the interconnection network necessary to test the network for short-circuits or breaks in the interconnections. However, as a result of microminiaturization the number of test points required to test the interconnection network has risen to the point where simultaneous physical contact with all of the test points has become impractical.

In a previous U.S. Pat. No. 3,803,483 I describe testing the conductive interconnection network prior to the mounting of the integrated circuit chips on the substrate. In this patented testing scheme semiconductor test chips are temporarily mounted on each of the sites in the module where integrated circuit chips are to be subsequently mounted. Each of the test chips has a number of diodes, each connecting a different terminal of the test chip to a common terminal. The chip sites are each surrounded by a set of contact points in the interconnection network. When the test chips are in place a probe head applies selected potential levels to each set of contact points one chip point at a time. Voltages are then measured at the common terminal of test chips at other chip sites of the interconnection network to test for short-circuits and breaks in the network.

While this method was satisfactory it did not check the interconnection networks with the actual integrated circuit chips in place and it requires the soldering and unsoldering of the test chips. It has been previously suggested in U.S. Pat. No. 3,789,205 to incorporate masking circuitry on the actual circuit chips which can be selectively activated to prevent the outputs of the logic circuits on certain circuit chips from being transmitted out into the interconnection network while another circuit chip on the substrate is being tested. However even with the masking circuits, it is impossible to check the interconnection network for continuity once the actual circuit chips are in place because, as pointed out previously, simultaneously probing the chips themselves is impractical.

THE INVENTION

In accordance with the present invention, circuits are provided for testing continuation of chip to chip and chip to substrate I/O pin connections after the actual circuit modules have been connected into the interconnection network. These circuits include emitter follower circuits on each of the chips which electrically connects the input terminals of the chip on which they reside to a common output terminal. The circuits also include the connective lines connecting common terminals of the chips to pins of the module. Now if masking circuits are also provided on each of the chips, as I previously suggested, mask circuits can be activated on all the chips and voltage applied to test sites on the substrate. Then the continuity of the lines of the interconnection network can be checked through the chip terminals by measuring if the voltage is reflected at the module pins that are coupled to the I/O terminal of the chips by the emitter follower circuits.

Accordingly, it is a primary object of the present invention to provide for testing the interconnection network on insulative substrates with semiconductor integrated circuit chips mounted thereon.

It is yet a further object of the present invention to provide for testing of such conductive interconnection networks which permits a determination to be made as to the integrity and operability of the network after the mounting of the integrated circuit chips on the substrate.

It is even another object of the present invention to permit the testing of the interconnection networks without simultaneously probing all of the test points.

The foregoing and other objects, features and advantages of the invention will be apparent from the following more particular description and preferred embodiments of the invention as illustrated in the accompanying drawings.

BRIEF DESCRIPTION OF THE DRAWINGS

FIG. 6 is a circuit diagram of a number of circuits added in accordance with the present invention.

PREFERRED EMBODIMENT

Figure 1:
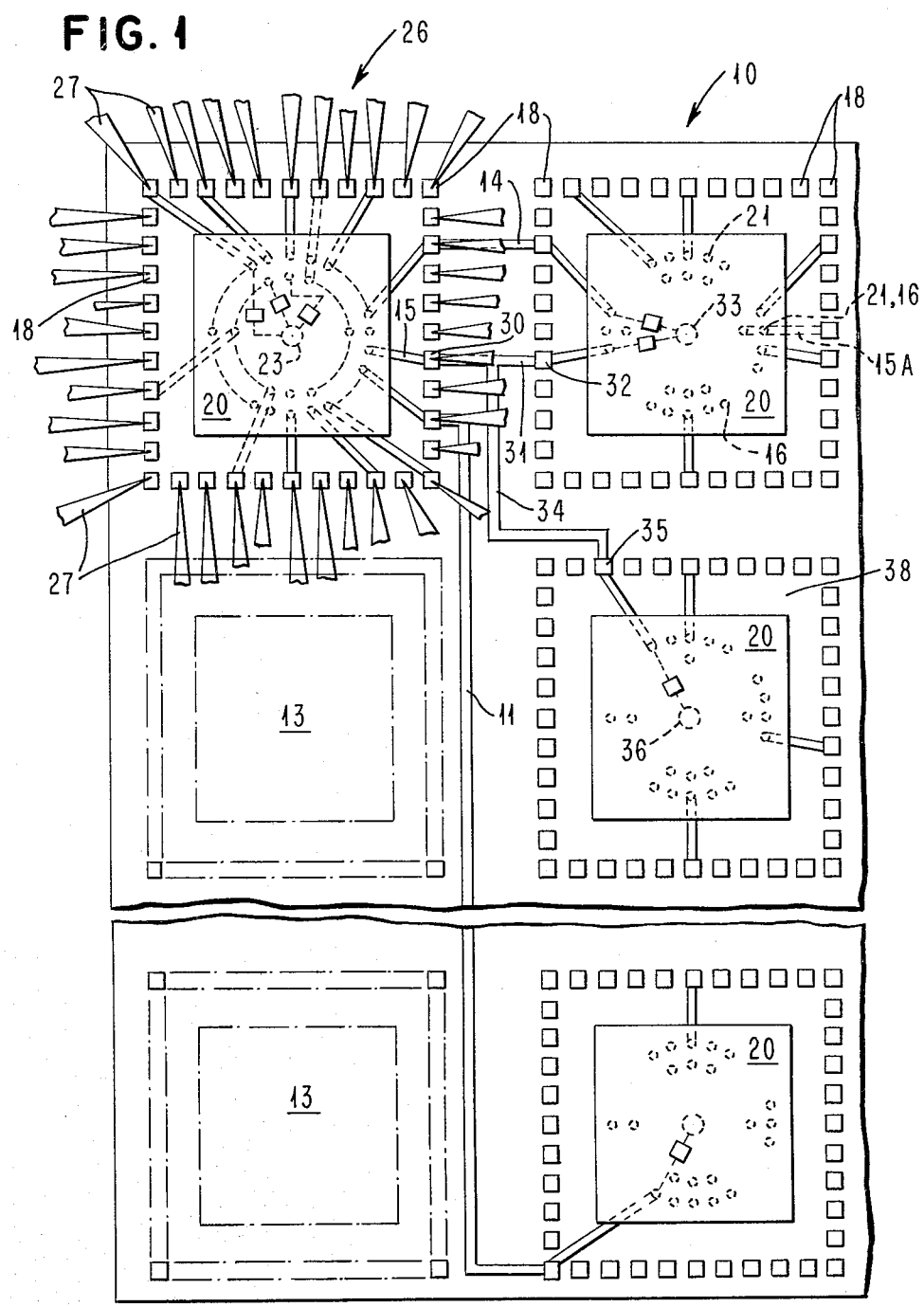
FIG. 1 is a diagrammatic fragmentary plan view of an insulative substrate containing an interconnection network which is being tested in accordance with the method of the present invention.
Figure 2:
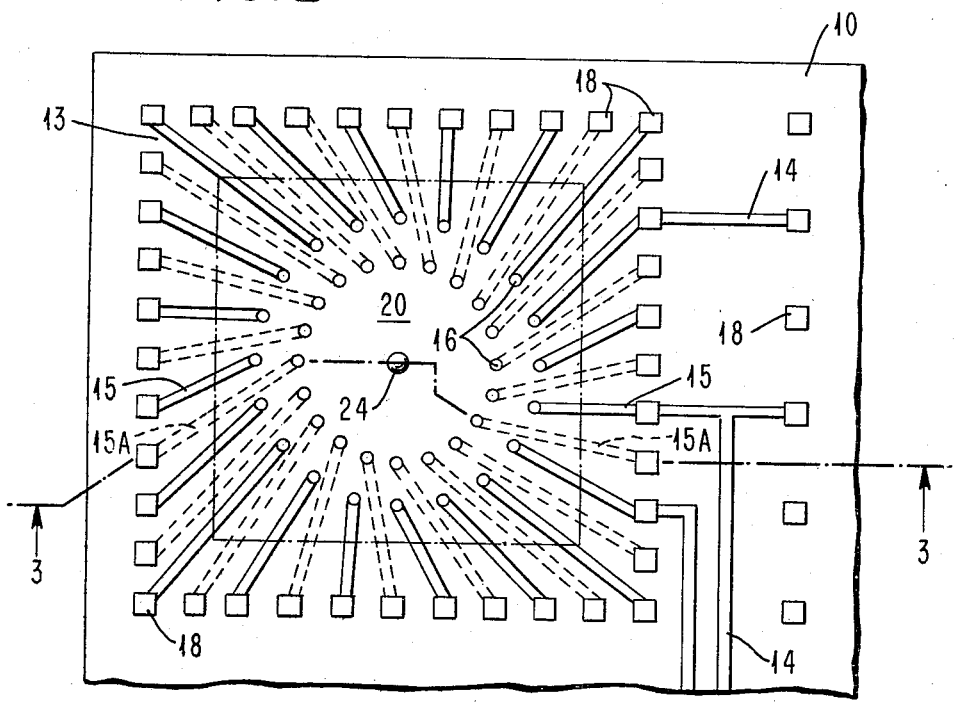
FIG. 2 is an enlarged diagrammatic fragmentary view of an insulative substrate with a chip mounted on the substrate.
Figure 3:
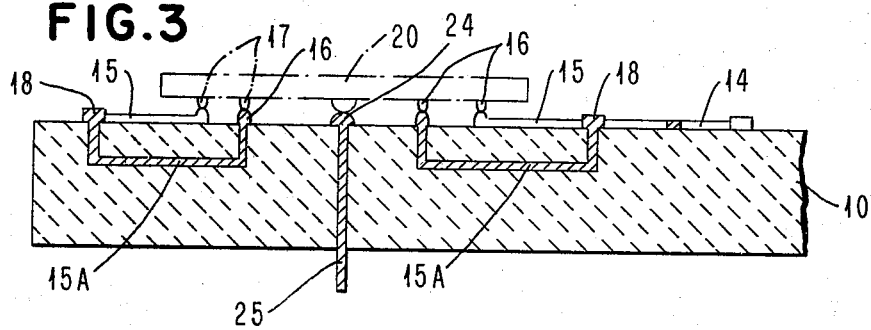
FIG. 3 is a cross-section taken along line 3—3 of FIG. 2.

As shown in FIGS. 1, 2 and 3, insulative substrate 10, has an interconnection network 11 thereon which interconnects integrated circuit chips 20 mounted at a plurality of chip sites on the surface of substrate 10. For convenience in describing the invention, only a few representative chip sites 13 and representative portions of the interconnection network 11 are shown.

The interconnection network comprises inter-chip site connectors 14, as well as intra-chip connectors 15. Furthermore, the interconnection network may have portions, such as connectors 14 and 15 (FIGS. 2 and 3), formed on the surface of substrate 10, as well as portions, such as intra-chip connectors 15A, which are formed below the surface level of substrate 10.

Substrate 10 may be conveniently made of a ceramic material, and in order to provide portions of the interconnection network, such as 15A, below the surface, a multi-level ceramic substrate may be used. Intra-chip connectors 15 and 15A connect interconnection network terminals 16 corresponding to chip terminals 17 and these chip terminals are mounted upon and bonded to the interconnection terminals when the integrated circuit chip is mounted on substrate 10. Intra-chip connectors 15 and 15A respectively connect network terminals 16 to an array of pads 18 which are arranged in groups around the periphery of each chip site and are utilized as test points in the subsequent testing of the interconnection network by contacting such test points or pads 18 with a plurality of probes. Inter-chip connectors 14 respectively connect pads 18 associated with one chip site with pads associated with another chip site to form the interconnections between chip sites.

For convenience of illustration, approximately fifty network terminals 16 are shown as being associated with each chip site and, consequently, the chips to be mounted at the site will have fifty corresponding terminals; also, fifty test points or pads 18 are associated with each chip site. However, the state of the integrated circuit art is such that realistically there would be many more chip terminals and, consequently, more pads 18 per chip site.

The chips 20 are mounted at each of the chip sites by a "controlled-collapse" technique in which the chip 20 terminals or pads are fused during joining. This "controlled-collapse" technique is described in detail in U.S. Pat. No. 3,429,040 and in the article "A Critique of Chip Joining Techniques", L. F. Miller, Solid State Technology, April 1970, pp. 50–62. It should be understood, of course, that the integrated circuit chips could be joined to the substrate by other techniques such as beam lead, ultra-sonic bonding or thermocompressing bonding which are also described in the above publication.

Figure 4:
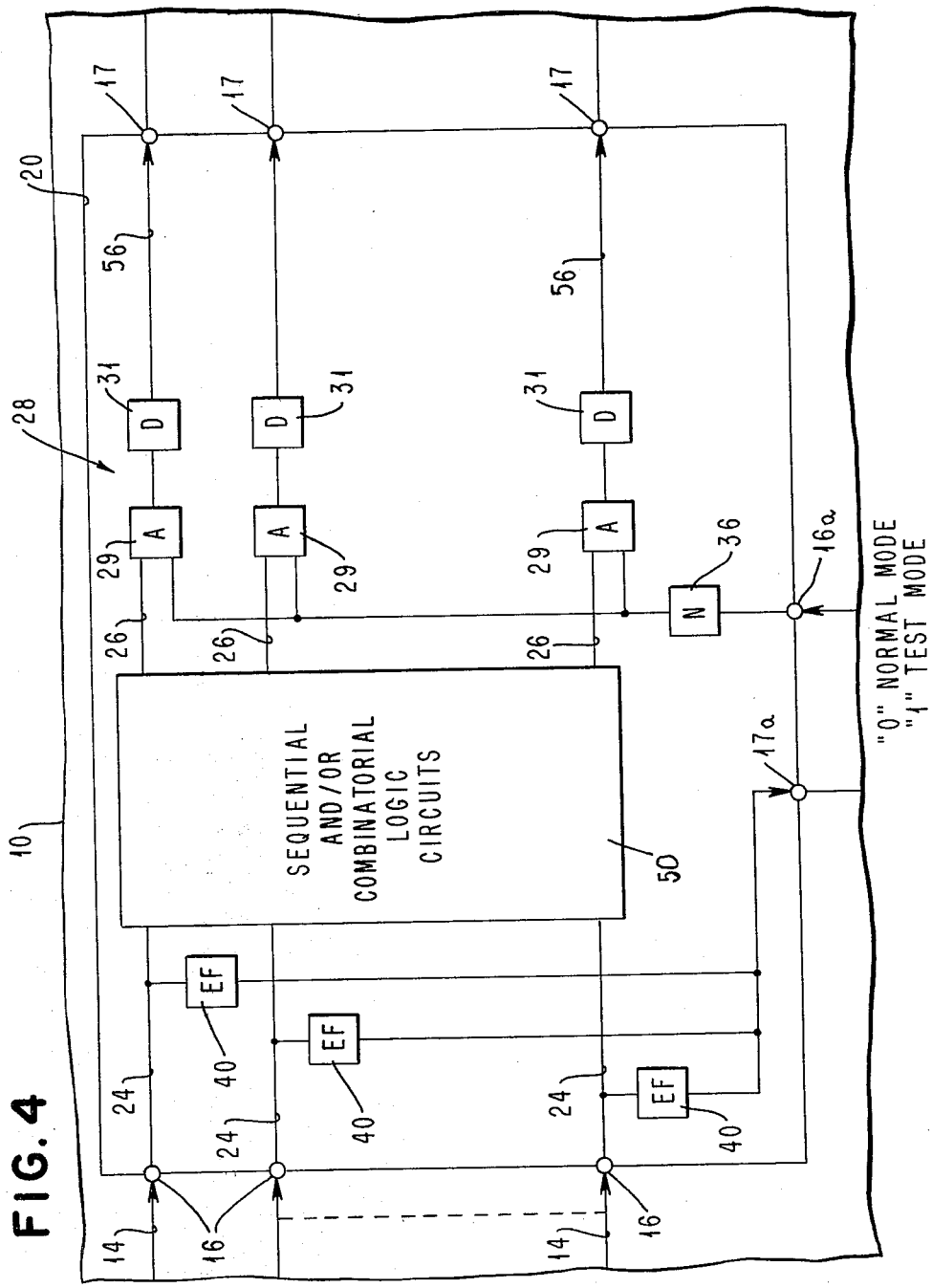
FIG. 4 is a schematic view of the circuitry on a typical chip mounted on the insulative substrate similar to the one shown in FIG. 2.
Figure 5:
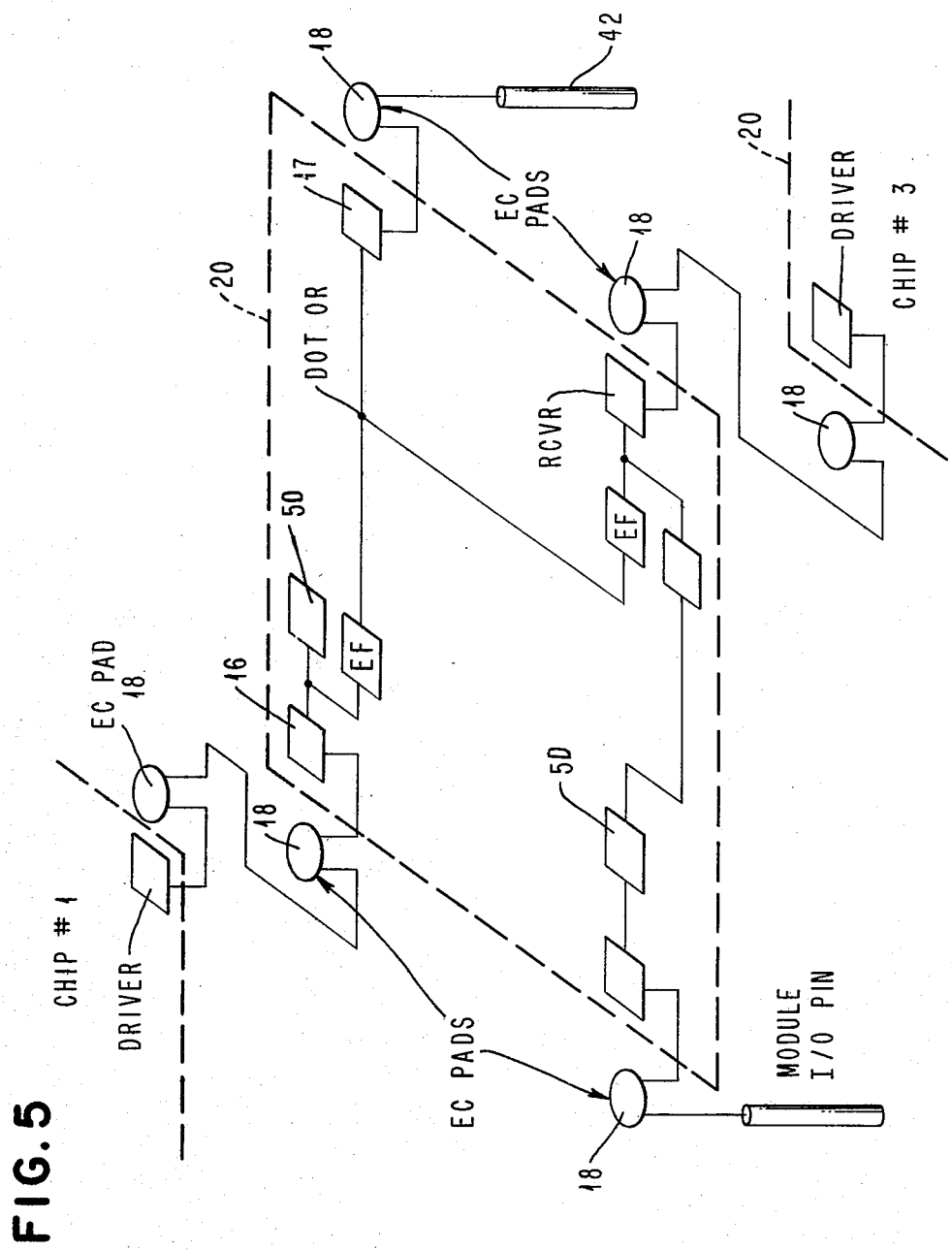
FIG. 5 is a schematic view of circuitry added to a substrate populated with chips by the present invention.

As shown in FIGS. 4, 5, and 6 each of the modules 20 mounted on the card 10 contains a plurality of both input terminals 16 and output terminals 17. These terminals are connected by conductors such as 14 and 15 on the module 10 to input and output pins of other chips on the module and to the input and output pins of the card.

The combinatorial and sequential logic circuits 50 are connected to the input terminals 16 by input lines 24 and to the output terminals by output lines 56. These chips 20 also have masking circuits 28 of the type described in the Background of the Invention portion of this specification for preventing the response of the logic circuits 50 from being sent out onto the lines of the module. This is used in testing out of the chips 20 after mounting of the chips on the module. The masking circuits typically include AND gates 29 positioned between output lines 45 of the logic circuits 50 and the drivers 31 for the chip. Besides receiving a logic signal from the logic circuits 50 each of these AND gates 29 receives a test control signal which comes to the chip on input terminal 16A and is inverted in inverter 36 and fed into the AND gates. When this signal is a binary "0" it permits output signals from the sequential and combinatorial logic circuits 50 to pass through to the drivers 31 and out onto the lines 14 and 15 of the module. However during test mode a binary "1" is applied to all but the chip being tested. This places a binary 0 at the inputs of the AND gates blocking the transmission of information from the logic circuits 50 to the drivers 31. The drivers 31 therefore are in their high impedance state and do not therefore transmit signals out onto the lines in the module.

In accordance with the present invention additional circuits are added to the logic chip. These circuits are emitter follower circuits 40. In addition to being connected to the logic circuits the input terminal of every chip on the module is connected to an input of a different emitter follower circuit 40 and the outputs of all the emitter follower circuits are logically ORed together and taken off the chip on output terminal 17A. As shown in FIG. 5 the signal generated by the emitter followers on any given chip eventually goes to a test pin 42 of the module so that the signals can be passed off the modules and detected by test equipment off the module.

In the described embodiment, emitter follower circuits 40 are used to transmit signals from the input terminals of the chip to the common terminal on the chip. This is technology dependent. Here the circuits used in the logic are transistor transistor logic circuits (TTL) and the emitter followers employed are compatible with that circuitry. However it should be understood that the emitter followers are not the only means of transmitting signals from the inputs through the chip. The most significant thing about these circuits is that they isolate the terminals of the chip from what is referred to as the common terminal and from one another. Therefore the emitter followers could be source followers if the technology were FET's or if desired could be diodes as in the above-mentioned patent.

For convenience in illustration, common chip terminal 23, substrate terminal 24 and pin 25 have been shown as being centrally located at the chip sites. This need not be the case. The common terminal may be located at any point in the chip provided that it is connected to a point in the substrate which may be externally accessed, either directly by a pin as shown, or indirectly by an interconnector which runs along the insulative substrate 10 to a point which is externally accessed by a pin. Since it is customary practice during the operation of the integrated circuit package to access points in the interconnector network with pins which provide the various power supplies required, such power pins may be conveniently utilized temporarily during testing for pin 25 to provide external access to the common terminal in the chips.

Let us now consider a typical test cycle with reference to FIG. 1. A tester probe head 26 is shown contacting test points 18 at the first chip site. The structure of the test probe head is merely illustrative of standard tester probe heads known in the art. The head comprises an array of probes 27, one for each of the fifty test points 18. A number of test probes 27 have been broken away so that the interconnector pattern 11 may be more readily seen. Head 26 is capable of moving in the X and Y directions. Each of the probes 27 is capable of applying selected voltages to test points 18 and capable of sensing voltage levels at these test points. The test probe head is controlled in the conventional manner by computer means, not shown, which have the capability of applying the voltages to the test points required by the testing procedure and for receiving and interpreting the data sensed by probes 27.

In a typical test procedure, a single test head 27 contacts test points 18 associated with each of the test sites in a pre-selected sequence. In FIG. 1, probe head 26 is shown in contact with test points 18 associated with the first of the chip sites. Intra-chip connector 15 connected to point 30 comes from an output driver.

Next, a pre-selected set of test patterns are applied to the test points 18 via the probe head 26. The intent of the test pattern is to exercise the circuits 25 contained within the chip. During the application of the test patterns, common terminal 33 of the second chip site and common terminal 36 of the third chip site are monitored. When point 30 goes to a logical 1 state, both terminals 33 and 36 should also go to a logical 1 state, demonstrating that interconnectors 31 and 34 are not open. In a like manner, the common terminals for all chip sites on the module are monitored during the application of the test pattern to the first chip site. Also, any module pins connected to the chip site being probed should be monitored.

Upon the application of a complete set of test patterns at the first chip site, test head 26 is stepped to the next chip site to be tested and the procedure is repeated.

It should be noted that in the case shown in FIG. 1, the chip in the second chip site is fed by more than one interconnection, 14 and 31, from the chip in the first chip site. Observations made at common terminal 33 will indicate a logical 1 if only one of the connections, 14 or 31, carry a logical 1 signal from the first chip site. It is very unlikely in actual practice that both interconnections 14 and 31 would simultaneously be at the logical 1 state throughout the entire sequence of test patterns. In any case, it is always possible to have a chip output to a logical 1 state using the test probes.

Accordingly, in the manner described, a single test head which is in contact with a single chip site at any one time is used to test all aspects of the interconnector network on substrate 10 related to said chip site. This avoids probing of more than one test site with more than one test head which becomes physically impractical because of increasing chip and test point densities.

While the invention has been particularly shown and described with reference to preferred embodiments thereof, it will be understood by those skilled in the art that the foregoing and other changes in form and details may be made therein without departing from the spirit and scope of the invention.

Having thus described my invention, what I claim as new, and desire to secure by Letters Patent is:

1. In the fabrication of integrated circuit packages wherein a plurality of semiconductor integrated circuit chips with logic performing circuits thereon are mounted at a plurality of chip sites on an insulative substrate having a network of conductive interconnectors for interconnecting input and output terminals of said plurality of chips, a method of testing the conductive interconnector network after the mounting of said chips which comprises logically connecting all input terminals of each chip to a common terminal of that chip with semiconductor devices mounted on that chip, temporarily blocking output signals of said logic performing circuits on said chips from reaching the output terminals of said chips, and testing for continuity across said input terminals between test points on the interconnector network and/or between said test points and said common terminals.

2. The testing method of claim 1 wherein said semiconductor devices are emitter follower circuits.

3. The testing method of claim 1 wherein the group of test points respectively associated with each of the chips and connected to the terminals of said chip are arranged spaced from said chip around the periphery of the chip site.

4. The method of claim 3 wherein said groups of test points are contacted with test probes one group at a time, said test probes applying input stimuli to the test points in said groups.

5. The method of claim 4 wherein the connections between the groups of test points associated with a respective chip and the terminals of said chip are tested by determining differences in potential levels between points in said groups contacted by said test probes.

6. The method of claim 4 wherein network interconnections between terminals of different chips mounted on said substrate are tested by applying a potential level to the test point associated with the terminal in the chip being probed which is being connected with a terminal in another chip, and sensing the potential level at the common terminal in said other chip.

7. An electronic circuit package in which a plurality of subassembly circuit packages with logic circuitry thereon are mounted on a base with an interconnection network for interconnecting the input and output terminals of the subassembly circuit packages with each other and with the terminals of the electronic circuit package wherein the subassembly packages each have masking circuits to prevent the outputs of logic circuits of the subassembly packages from being transmitted out onto the interconnection network while logic circuits of another one of the subassembly packages are being tested, the improvement comprising, semiconductor connection circuit means on each of said subassembly packages for logically connecting all the input and output terminals of each of the subassembly packages together to an additional common terminal of the subassembly package, circuit means on said base for simultaneously activating all said masking circuits and, circuit means for coupling the outputs of all said common terminals to a terminal of the electronic circuit package whereby the interconnection network can be tested while the subassembly packages are operatively mounted on said base.

8. The electronic circuit package of claim 7 wherein said semiconductor connection circuits are emitter follower circuits with their inputs each coupled to the one of the terminals of the subassembly package and their outputs logically connected together and to the common terminal of the subassembly package.

* * * * *